United States Patent
Chang et al.

(12) 
(10) Patent No.: US 7,864,999 B2
(45) Date of Patent: Jan. 4, 2011

(54) DEVICES SYSTEMS AND METHODS FOR PROCESSING IMAGES

(75) Inventors: Ti-chiun Chang, Plainsboro, NJ (US); Lin He, Los Angeles, CA (US); Tong Fang, Morganville, NJ (US)

(73) Assignee: Siemens Medical Solutions USA, Inc., Malvern, PA (US)

( * ) Notice: Subject to any disclaimer, the term of this patent is extended or adjusted under 35 U.S.C. 154(b) by 800 days.

(21) Appl. No.: 11/539,985

(22) Filed: Oct. 10, 2006

(65) Prior Publication Data

US 2007/0110290 A1    May 17, 2007

Related U.S. Application Data

(60) Provisional application No. 60/728,159, filed on Oct. 19, 2005.

(51) Int. Cl.
*G06K 9/00* (2006.01)
*G06K 9/36* (2006.01)

(52) U.S. Cl. ........................... 382/128; 382/280

(58) Field of Classification Search .............. 382/100, 382/128–134, 210, 280; 128/922; 600/300, 600/407; 601/2; 708/5, 6, 100
See application file for complete search history.

(56) References Cited

U.S. PATENT DOCUMENTS 6,208,138 B1 * 3/2001 Lai et al. .................. 324/307

OTHER PUBLICATIONS

Kapoor S. et al.(IEEE Transaction on Pattern Analysis and Machine Intelligence, "Depth and Image Recovery Using a MRF Model", S. Kapoor, P. Y. Mundkur, U. B. Desai, 1994 IEEE 0162-8828/94, 1117-1122) Depth and Image Recovery Using a MRF Model.*

* cited by examiner

*Primary Examiner*—Samir A. Ahmed
*Assistant Examiner*—Mehdi Rashidian

(57) ABSTRACT

Certain exemplary embodiments can comprise a method, which can comprise providing machine instructions adapted to render a final enhanced image of an object based upon a final enhanced set of data. The final enhanced set of data can be derived from a detected set of data obtained from an imaging device, such as a medical imaging device.

18 Claims, 6 Drawing Sheets

DEVICES SYSTEMS AND METHODS FOR PROCESSING IMAGES

CROSS-REFERENCES TO RELATED APPLICATIONS

This application claims priority to, and incorporates by reference herein in its entirety, U.S. Provisional Patent Application Ser. No. 60/728,159, filed 19 Oct. 2005.

BRIEF DESCRIPTION OF THE DRAWINGS

A wide variety of potential practical and useful embodiments will be more readily understood through the following detailed description of certain exemplary embodiments, with reference to the accompanying exemplary drawings in which.

DETAILED DESCRIPTION

Certain exemplary embodiments can comprise a method, which can comprise providing machine instructions adapted to render a final enhanced image of an object based upon a final enhanced set of data. The final enhanced set of data can be derived from a detected set of data obtained from an imaging device, such as a medical imaging device.

Figure 1:
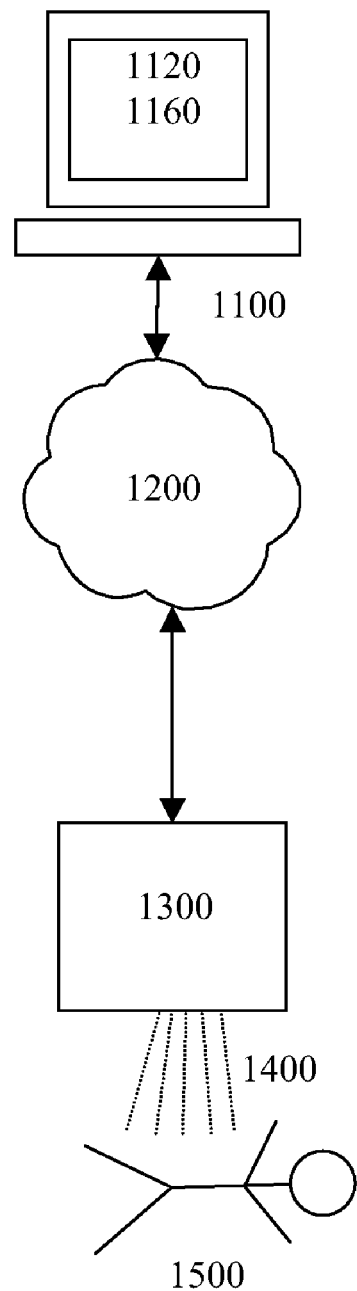
FIG. 1 is a block diagram of an exemplary embodiment of a system 1000.

FIG. 1 is a block diagram of an exemplary embodiment of a system 1000, which can comprise an imaging device 1300. Imaging device 1300 can be any device adapted to provide an image, such as an image of a patient 1500. For example, imaging device 1300 can be a device adapted for magnetic resonance (MR) imaging, X-ray imaging, and/or computed tomography (CT) imaging. Imaging data can be obtained regarding patient 1500 via imaging device 1300 utilizing imaging device emissions 1400.

Imaging device 1300 can be communicatively coupled to an information device 1100 via a network 1200. Information device 1100 can comprise a user program 1160, which can be adapted to analyze, process, and/or enhance image data from imaging device 1300. For example, user program 1160 can be adapted to determine an enhanced image by performing a minimization algorithm, which can comprise a Bregman iteration. Information device 1100 can comprise a user interface 1120, which can be adapted to render image information associated with imaging device 1300.

Figure 2:
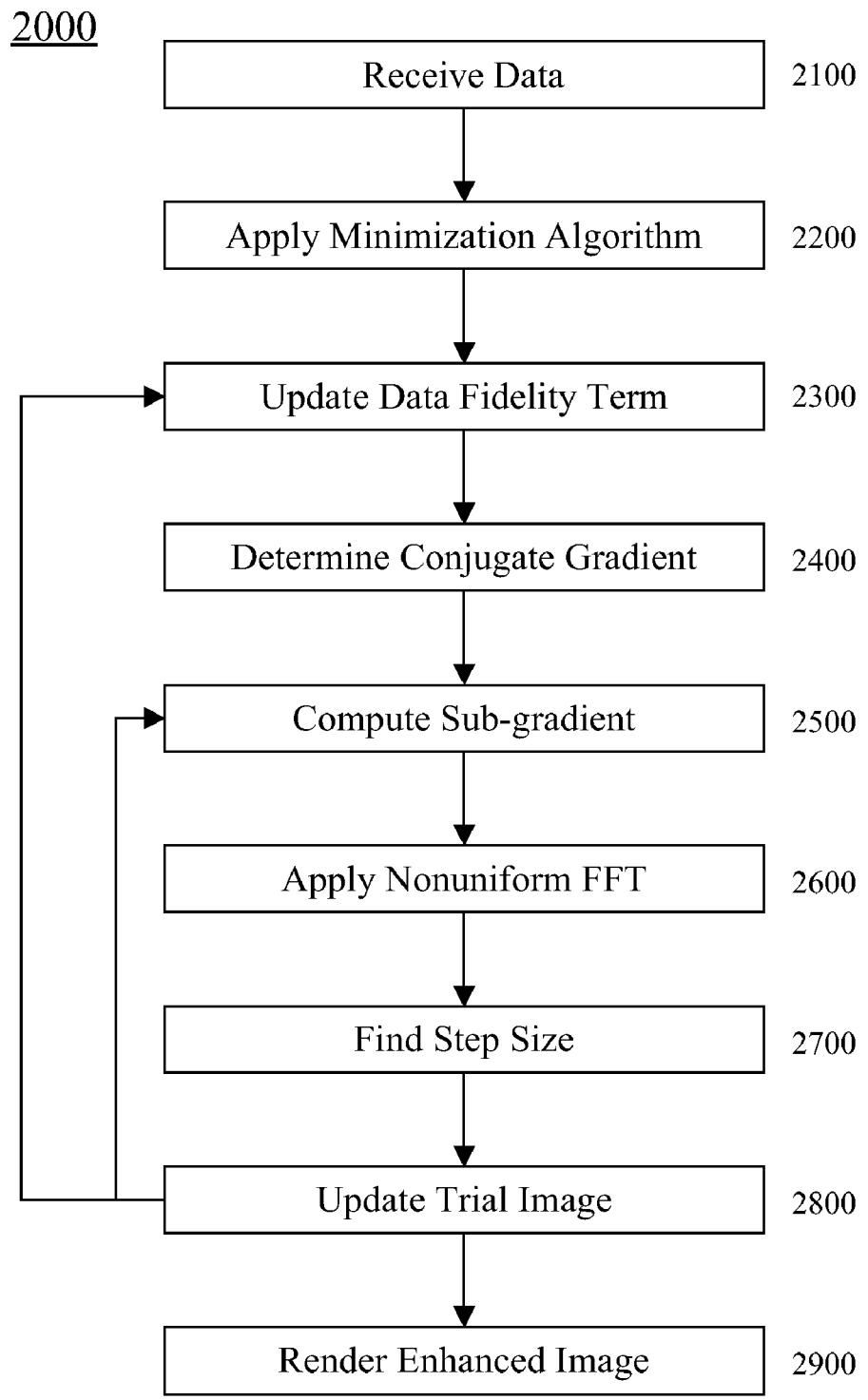
FIG. 2 is a flowchart of an exemplary embodiment of a method 2000.

FIG. 2 is a flowchart of an exemplary embodiment of a method 2000. At activity 2100, a first set of data can be requested, received, derived, detected, and/or obtained from an imaging device and/or system, such as a medical imaging device and/or system, such as a magnetic resonance device and/or system.

At activity 2200, a minimization algorithm can be applied to the data obtained from the imaging device, which can be an iterative minimization algorithm. The minimization algorithm can be applied to a formulated and/or pre-formulated functional that comprises a norm of a sparse representation of a trial image derived from the first set of data and/or a data fidelity term. Certain exemplary embodiments can be adapted to determine the sparse representation of the trial image. The formulated and/or preformulated functional can be based upon a trial image derived from the first set of data. In certain exemplary embodiments, the formulated functional can comprise a curvelet transform. Certain exemplary embodiments can be adapted to determine the norm of the sparse representation of the trial image. The minimization algorithm can comprise a conjugate gradient sub-algorithm and/or a Bregman iteration.

In certain exemplary embodiments, the minimization algorithm can attempt to minimize an equation:

$$\min_m \|\Psi(m)\|_1 + \lambda \|Am - y\|_2^2$$

where:
  m is a representation of the trial image;
  ψ is a transformation that transforms the representation of the trial image into a sparse representation;
  λ is a Lagrange multiplier;
  || || is a norm;
  A is a non-uniform Fourier transform matrix; and
  y is undersampled measured k-space data.

In certain exemplary embodiments, the formulated functional can comprise a term:

$$\|m\|_{BV} = \sum_{i,j} \sqrt{|\nabla_x m_{re}(i,j)|^2 + |\nabla_x m_{im}(i,j)|^2 + |\nabla_y m_{re}(i,j)|^2 + |\nabla_y m_{im}(i,j)|^2}$$

where:
  m is a representation of the trial image;
  $m_{re}$ is a real component of the representation of the trial image;
  $m_{im}$ is an imaginary component of the representation of the trial image;
  ψ is a transformation that transforms the representation of the trial image into a sparse representation;
  $\|m\|_{BV}$ is a bounded variation norm;
  ∇ is a gradient symbol;
  | is an absolute value of an expression;
  x is a horizontal direction in the representation of the trial image in a predetermined coordinate system;
  y is a vertical direction in the representation of the trial image in the predetermined coordinate system;
  i is an index for pixels in a vertical direction in the predetermined coordinate system; and
  j is an index for pixels in a horizontal direction in the predetermined coordinate system.

In certain exemplary embodiments, the formulated functional can comprise a term:

$$m = \sum_p \alpha_{L,p} \varphi_{L,p} + \sum_{q=L+1}^{J} \sum_p \alpha_{q,p} \phi_{q,p}$$

where:
  m is a representation of the trial image;
  J is related to a length of the signal by $N=2^J$;
  L is a lowest level (coarsest level) in a multi scale representation;

$\alpha_{p,q}$ are transformed coefficients;
$\phi_{L,p}$ are scaling functions;
$\phi_{q,p}$ are oscillatory wavelets;
q is an index for different levels; and
p is an index for a $p^{th}$ element in the multiscale representation.

In certain exemplary embodiments, the Bregman iteration can comprise an algorithm attempting to solve an equation:

$$m_k^* = \arg\min_m \{J(m) + \lambda H(m, y + v_{k-1}^*)\}$$

where:
m is a representation of the trial image;
k is an iteration count for the Bregman iteration;
J(m) is a regularization function;
$H(m, y+v^*_{k-1})$ is the data fidelity term; and
$\lambda$ is a Lagrange multiplier.

At activity 2300, the data fidelity term can be updated at each iteration of the Bregman iteration.

At activity 2400, a conjugate gradient can be determined, such as at each iteration of the Bregman iteration. The conjugate gradient can be determined via the conjugate gradient sub-algorithm, which can comprise a plurality of iterations. The conjugate gradient sub-algorithm can be adapted to update the trial image.

In certain exemplary embodiments, the conjugate gradient sub-algorithm can comprise evaluating an equation:

$$\nabla \|m\|_{BV} = \zeta_{i-1,j}^x - \zeta_{i,j}^x + \zeta_{i,j-1}^y - \zeta_{i,j}^y,$$

where:

$$\zeta_{i,j}^x = \frac{\nabla_x m(i,j)}{\sqrt{|\nabla_x m_{re}(i,j)|^2 + |\nabla_y m_{re}(i,j)|^2 + |\nabla_x m_{im}(i,j)|^2 + |\nabla_y m_{im}(i,j)|^2} + \varepsilon}$$

$$\zeta_{i,j}^y = \frac{\nabla_y m(i,j)}{\sqrt{|\nabla_x m_{re}(i,j)|^2 + |\nabla_y m_{re}(i,j)|^2 + |\nabla_x m_{im}(i,j)|^2 + |\nabla_y m_{im}(i,j)|^2} + \varepsilon}$$

m is a representation of said trial image;
$m_{re}$ is a real component of said representation of said trial image;
$m_{im}$ is an imaginary component of said representation of said trial image;
$\epsilon$ is a small constant;
$\nabla$ is a gradient symbol;
$\|$ is an absolute value of an expression;
x is a horizontal direction in the representation of the trial image in a predetermined coordinate system;
y is a vertical direction in the representation of the trial image in the predetermined coordinate system;
i is an index for pixels in a vertical direction in the predetermined coordinate system; and
j is an index for pixels in a horizontal direction in the predetermined coordinate system.

At activity 2500, a sub-gradient can be determined. For example, at each iteration of the plurality of iterations of the conjugate sub-algorithm, an update direction can be found, a sub-gradient of the norm of the sparse image representation can be computed, and/or a gradient of the data fidelity term can be computed.

At activity 2600, a nonuniform Fourier transform can be applied to the trial image. In certain exemplary embodiments, at each iteration of the plurality of iterations of the conjugate sub-algorithm, a non-uniform Fourier transform of an intermediate enhanced image can be determined. The nonuniform Fourier transform can be applied at each iteration of the plurality of iterations of the conjugate sub-algorithm. In certain exemplary embodiments, the first set of data and/or a matrix derived therefrom can be subtracted from and/or compared to the nonuniform Fourier transform. An adjoint of the nonuniform Fourier transform can be determined and/or used to obtain the gradient of the data fidelity term.

At activity 2700, a step size can be found in the update direction at each iteration of the plurality of iterations of the conjugate gradient sub-algorithm. In certain exemplary embodiments, the step size can be determined using a backtracking line search algorithm.

At activity 2800, a trial image can be updated at each iteration of the plurality of iterations of the conjugate sub-algorithm. The trail image can be updated based upon the update direction and/or the step size. The Bregman iteration can be performed for a predetermined number of iterations and/or until the minimization algorithm reaches a predetermined threshold. Upon completion of the Bregman iteration the trial image can be a final enhanced image associated with a final enhanced set of data. The final enhanced set of data can be derived from the first set of data obtained from the imaging device.

At activity 2900, the enhanced image can be rendered, such as via a user interface. The image can be rendered via machine instructions.

Certain exemplary embodiments can reduce scan times in magnetic resonance imaging (MRI) and can provide relatively good temporal resolution and/or can reduce one or more motion artifacts in dynamic imaging. Since scan time can be proportional to a number of samples acquired in k-space, certain exemplary embodiments can utilize a sparse k-space sampling for acquisition acceleration. Certain exemplary embodiments can utilize an iterative approach that attempts to minimize a cost functional that includes a $L^1$ norm of a sparse representation of the reconstructed image and a constraint term that is imposed by the raw measurement data in k-space. The sparse representation can be analyzed via a total variational regularization and/or a wavelet transform. Certain exemplary embodiments can utilize a Bregman iteration. With an undersampling ratio that is greater than approximately six; experimental results indicate that an exemplary embodiment can reconstruct images that have relatively good image quality.

Magnetic resonance imaging (MRI) can be utilized for imaging parts of the body that are stationary. However, certain exemplary MRI systems can have a relatively slow imaging speed. Certain exemplary applications of MRI can seek relatively fast imaging, e.g., a short scan time. Certain exemplary embodiments can sample a frequency plane (or k-space) relatively sparsely.

In certain exemplary embodiments, a signal can be recovered from incomplete frequency information. Certain exemplary embodiments can be based on minimizing a sparse representation of a target signal while utilizing a constraint so that the original sparse frequency samples are maintained. For certain exemplary MRI measurements with a radial or spiral trajectory, a reconstructed MR image quality can be relatively good. Specifically, the $L^1$ minimization problem can be formulated as $$\min_m \|\psi(m)\|_1 \, s.t. Fm = y, \quad (1)$$

where m is the reconstructed signal/image, ψ transforms the image m into a sparse representation, F is a Fourier operator which fulfills Fm=y; and v is an under-sampled k-space data. A symbol $\|\cdot\|_p$ denotes a $L^p$ norm, with p=1 in (1).

By incorporating a constraint term in (1) into the cost functional, certain exemplary embodiments can apply a Bregman iteration to attempt to solve the modified cost functional. In certain exemplary embodiments, for a noisy measurement and/or observation y, by denoting the residual for the first iteration as $v_0$=0, a reconstructed image in $m_0$ can be obtained after solving a minimization for the observed data y+$v_0$; at the kth (k>0) iteration, $v_k$=y+$v_{k-1}$−NUFFT ($m_k$), the reconstructed image $m_k$ can be obtained by performing a minimization from y+$v_{k-1}$. The resulting sequence of $\{m_k\}$ can converge monotonically in $L^2$ to the noisy image m such that Fm=y. If F is an identity matrix and m is noise free, then the image sequence $\{m_k\}$ can converge to the true image m. In addition, the sequence $\{m_k\}$ can monotonically get closer to the noise free image m in the sense of Bregman distance. In certain exemplary embodiments, a Bregman iteration can be applied to solve a modified formulation of (1) to obtain a sequence of reconstructed MR image $\{m_k\}$ where F$m_k$ converges to y. In certain exemplary embodiments, fine details in the image can be recovered.

In certain exemplary embodiments, a desired image can be considered as the solution to a minimization problem, where the cost functional can comprise a regularization term and a data fidelity term. The regularization term can be considered as image modeling such as piece-wise smooth or edge-preserving regularization. In certain exemplary embodiments, the fidelity term can utilize projection data and/or noisy observations for computed tomography and/or image restoration.

In certain exemplary embodiments, first hand data can be k-space samples. Certain exemplary embodiments can utilize a different treatment for the data fidelity term. In its general form, the cost functional can be expressed as $$E(m) = R(m) + \lambda \|Am - y\|_2^2, \quad (2)$$

where R(m) is a regularization penalty, and A is a linear operator that can transform a trial image into the domain of the data sources y, which can be k-space samples, projection data, and noisy observation, respectively, for the MR image reconstruction, tomographic reconstruction, and image restoration. The Lagrange multiplier λ can be considered as a weighting factor between the two terms in (2). The operator A can be defined for each different application. For MRI, A can be a generalized Fourier transform, which can be a regular or a non-uniform Fourier transform. For computed tomography, A can be a projection operation or a discrete Radon transform. For image restoration, A can be an identity matrix.

Certain exemplary embodiments can comprise a formulation for R(m), such as:

$$R(m) = \sum_i w_i \|\psi_i(m)\|_1, \quad (3)$$

where $\psi_i$(m) represents one of the sparse representation for image m. The index i can be used to distinguish different representations, with each having weighting $w_i$. Possible realizations for $\psi_i$(m) can comprise a total variation (TV) model, wavelet transform, curvelet transform, and/or any image transformation. Certain exemplary embodiments can utilize a TV model and/or a wavelet transform.

To minimize equation (2), certain exemplary embodiments can utilize a nonlinear conjugate gradient that find the solution at iteration k as $$m_{k+1} = m_k + \alpha_k d_k, \quad (4)$$

where $$d^{k+1} = -\nabla E(m_{k+1}) + \beta_{k+1} d_k, \text{ with} \quad (5)$$

$$d_0 = -\nabla E(m_0) \text{ and } \beta_{k+1} = \frac{|\nabla E(m_{k+1})|^2}{|\nabla E(m_k)|^2},$$

and $$\alpha_k = \underset{\alpha}{\arg\min} E(m_k + \alpha d_k). \quad (6)$$

A search for α, in (6) can comprise a backtracking line search, which can comprise a method, which in pseudocode can comprise:

given a descent direction d for the energy functional E,
γ∈(0,0.5), ϵ∈(0,1); initializing α:=1;
and while E(m+αd)>E(m)+γα∇E(m)$^T$d, setting α:=δα.

A total variation regularization or a so-called bounded variation (BV) norm can be utilized in the context of image denoising. Certain exemplary embodiments can be utilized for deconvolution, decomposition, and/or computer tomography, etc. Certain exemplary embodiments can recover piecewise smooth functions without smoothing sharp discontinuities while also being a sparse transformation for piecewise constant functions.

In certain exemplary embodiments, the bounded variation norm of a two dimensional real image m can be defined as:

$$\|\psi_1(m)\|_1 = \|m\|_{BV} := \sum_{i,j} \sqrt{|\nabla_x m(i,j)|^2 + |\nabla_y m(i,j)|^2}. \quad (7)$$

In certain exemplary embodiments, a reconstructed image in from (1) equals the magnitude of a complex image ($m_{re}$, $m_{im}$) from the inverse Fourier transform of the under-sampled data y, i.e., m=$\sqrt{m_{re}^2 + m_{im}^2}$. Certain exemplary embodiments might not define the BV norm of image m by (7) due to the non-convexity of this formulation. Certain exemplary embodiments might define the BV norm of m as $$\|m\|_{BV} = \sum_{i,j} \sqrt{\begin{aligned}&|\nabla_x m_{re}(i,j)|^2 + |\nabla_x m_{im}(i,j)|^2 + \\ &|\nabla_y m_{re}(i,j)|^2 + |\nabla_y m_{im}(i,j)|^2\end{aligned}}. \quad (8)$$

In certain exemplary embodiments, the BV norm of m can be:

$$\|m\|_{BV} = \sum_{i,j} \sqrt{|\nabla_x m_{re}(i,j)|^2 + |\nabla_y m_{re}(i,j)|^2} + \sqrt{|\nabla_x m_{im}(i,j)|^2 + |\nabla_y m_{im}(i,j)|^2}. \quad (9)$$

The minimization of equations (8) and (9) subject to the constraint condition Fm=y might converge. Certain exemplary experiments indicate similar results can be obtained utilizing equation (8) and equation (9).

To compute ∇E, certain exemplary embodiments can evaluate a sub-gradient of (8) with respect to m $$\nabla \|m\|_{BV} = \zeta^x_{i-1,j} - \zeta^x_{i,j} + \zeta^y_{i,j-1} - \zeta^y_{i,j}, \quad (10)$$

where $$\zeta^x_{i,j} = \frac{(\nabla_x m(i,j))}{\sqrt{|\nabla_x m_{re}(i,j)|^2 + |\nabla_y m_{re}(i,j)|^2 + |\nabla_x m_{im}(i,j)|^2 + |\nabla_y m_{im}(i,j)|^2} + \varepsilon} \quad (11)$$

and $$\zeta^y_{i,j} = \frac{\nabla_y m(i,j)}{\sqrt{|\nabla_x m_{re}(i,j)|^2 + |\nabla_y m_{re}(i,j)|^2 + |\nabla_x m_{im}(i,j)|^2 + |\nabla_y m_{im}(i,j)|^2} + \varepsilon} \quad (12)$$

In certain exemplary embodiments, ε can be a small constant adapted to provide numerical stability.

In certain exemplary embodiments, the wavelet transform can provide relatively parsimonious representations for a large class of signals.

In certain exemplary embodiments, the $L^1$ wavelet norm $\|\psi_2(g)\|$, can be defined and/or a sub-gradient thereof can be derived. Certain exemplary embodiments consider a one dimensional signal g. Assuming that the coarsest and finest level in a wavelet representation are, respectively, L and J, the signal g can be decomposed as $$g = \sum_p \alpha_{L,p} \varphi_{L,p} + \sum_{q=L}^{J-1} \sum_p \alpha_{q,p} \phi_{q,p}, \quad (13)$$

where the $\phi_{L,p}$ are scaling functions, the $\phi_{q,p}$ are oscillatory wavelets. Then the $L^1$ wavelet norm $\|\psi_2(g)\|_l$ can be defined as:

$$\|\psi_2(g)\|_1 = \|g\|_W := \sum_p |\alpha_{L,p}| + \sum_{q=L}^{J-1} \sum_p |\alpha_{q,p}|. \quad (14)$$

From (13), for the signal g and an arbitrary signal h, certain exemplary embodiments can assume:

$$\begin{cases} g = \sum_p \alpha_{L,p} \varphi_{L,p} + \sum_{q=L}^{J-1} \sum_p \alpha_{q,p} \phi_{q,p}, \\ h = \sum_p \beta_{L,p} \varphi_{L,p} + \sum_{q=L}^{J-1} \sum_p \beta_{q,p} \phi_{q,p}. \end{cases}$$

The sub-gradient of $\|g\|_w$ can be defined as:

$$\lim_{s \to 0} \frac{1}{S} \left( \frac{\|g + sh\|_W -}{\|g\|_W} \right) = \lim_{s \to 0} \frac{1}{S} \left( \sum_{p,q} |\alpha_{p,q} + s\beta_{p,q}| - \sum_{p,q} |\alpha_{p,q}| \right) \quad (15)$$

$$= \sum_{p,q} sgn(\alpha_{p,q})\beta_{p,q}$$

$$= \left( \sum_p sgn(\alpha_{L,p})\varphi_{L,p}, \sum_p \beta_{L,p}\varphi_{L,p} \right) +$$

$$\left( \sum_{q=L}^{J-1} \sum_p sgn(\alpha_{q,p})\phi_{q,p}, \sum_{q=L}^{J-1} \sum_p \beta_{q,p}\phi_{q,p} \right)$$

$$= \left( \sum_p sgn(\alpha_{L,p})\varphi_{L,p} + \sum_{q=L}^{J-1} \sum_p sgn(\alpha_{q,p})\phi_{q,p}, h \right).$$

In certain exemplary embodiments, the scaling functions φ and the wavelet functions ϕ are an orthonormal basis. Thus, the sub-gradient of $\|g\|_w$ law might be:

$$\sum_p sgn(\alpha_{L,p})\varphi_{L,p} + \sum_{q=L}^{J-1} \sum_p sgn(\alpha_{q,p})\phi_{q,p},$$

which can be implemented via an inverse wavelet transformation.

To impose the constraint that a reconstructed image has approximately the same Fourier coefficients at those sampling locations, certain exemplary embodiments can round off sampling coordinates to integer grids. Nonzero integer grids can become the constraint set. Certain exemplary embodiments can correspond to zero order interpolation. Such embodiments might impose a condition Am=y so that an inverse fast Fourier transform (FFT) can be applied. Combining with the minimization of the regularization term R(m), m can converge to a solution of equation (1) via a projection onto a convex set.

Certain exemplary embodiments can retain locations of sampled data and use a non-uniform T operator. In certain exemplary embodiments, Fourier coefficients at the sampling locations can be close y. Certain exemplary embodiments can attempt to minimize $\|Am-y\|_2^2$, where A denotes the non-uniform FFT operator. The NUFFT can be implemented via an inverse gridding procedure. The sub-gradient of such a constraint term can be expressed as Â(Am−y), where Â is the adjoint of A.

Certain exemplary embodiments can utilize a Bregman iteration. Certain exemplary embodiments can attempt to minimize an equation of a model:

$$\min_m \{J(m) + \lambda H(m, y)\},$$

where m and y denote, respectively, a trial image and an observation. The regularization term J(m) and the fidelity term H(m, y) can be convex functionals of m. The regularization term, J(m), can be non-negative.

In certain exemplary embodiments, J(m) can be differentiable and the Bregman distance associated with J can be defined by:

$$D_J(m_1,m_2) = J(m_1) - J(m_2) - \langle m_1 - m_2, \partial J(m_2) \rangle,$$

where $m_1$ and $m_2$ are two trial images; $\langle \cdot, \cdot \rangle$ denotes the inner product in the real number space $R^n$; and $\partial J(m_2)$ is an element of the sub-gradient of J at $m_2$.

Since J(m) can be convex, $D_J(m_1,m_2)$ can be convex in $m_1$ for $m_2$. The quantity $D_J(m_1,m_2)$ might not exhibit one or more properties associated with a distance. For example, in certain exemplary embodiments, $D_J(m_1,m_2) \neq D_J(m_2,m_1)$; and a triangle inequality might not hold. The Bregman distance can be a measure of closeness in that $D_J(m_1,m_2) \geq 0$ and $D_J(m_1,m_2) = 0$ if $m_1 = m_2$.

Suppose $m_1^*$ is the minimizer of $J(m) + \lambda H(m, y)$. An iterative procedure can be given by a sequence of variational problems for $k \geq 2$, $$m_k^* = \arg\min_m \{D_J(m, m_{k-1}^*) + \lambda H(m, y)\}. \quad (16)$$

In certain exemplary embodiments, $$H(m, y) = \frac{\|Am - y\|_2^2}{2},$$
$$J(m) = w_1 \|\psi_1(m)\|_1 + w_2 \|\psi_2(m)\|_1.$$

In certain exemplary embodiments, $Am_k^*$ can monotonically converge in the $L^2$ norm to the Fourier coefficients y on the constraint set. Empirically with small $\lambda$, applying the Bregman iteration in the context of image denoising can lead to a relatively smooth resulting image in relatively early iterations. In certain exemplary embodiments, fine scales can be recovered along the Bregman iteration before the image becomes noisy.

In certain exemplary embodiments, the sub-gradient of equation (16) can be taken. For $k \geq 2$, equation (16) can lead to:

$$\lambda H_m(m_k^*, y) + \partial J(m_k^*) - \partial J(m_{k-1}^*) = 0, \quad (17)$$

and for $k = 1$, $$\lambda \hat{A}(Am_1^* - y) + \partial J(m_1^*) = 0.$$

Write $y - Am_1^* = v_1^*$, i.e.

$$\partial J(m_1^*) = \lambda \hat{A} v_1^*.$$

Plugging the above equation into (17) for $k=2$ can provide:

$$\lambda \hat{A}(Am_2^* - y) + \partial J(m_2^*) - \lambda \hat{A} v_1^* = 0,$$

which can be further simplified as $$\lambda \hat{A}(Am_2^* - y - v_1^*) + \partial J(m_2^*) = 0.$$

Setting $y + v_1^* - Am_2^* = v_2^*$, can provide:

$$\partial J(m_2^*) = \lambda \hat{A} v_2^*.$$

From above, certain exemplary embodiments can denote $v_0^* < 0$ and $$v_k^* = y + v_{k-1}^* - Am_k^* \quad \forall k \geq 1.$$

The following equation can be derived:

$$\partial J(m_k^*) = \lambda \hat{A} v_k^*.$$

In certain exemplary embodiments, to apply the Bregman iteration, the constraint set of Fourier coefficients from y to $y + v_{k-1}^*$ at the kth iteration can be changed. In certain exemplary embodiments, solving the sequence minimizing problem of (16) can be solved the solving the following sequence minimizing problem $$m_k^* = \arg\min_m \{J(m) + \lambda H(m, y + v_{k-1}^*)\}. \quad (18)$$

This optimization can again be achieved by the non-linear conjugate gradient algorithm.

Raw MR measurement data were obtained from a Siemens Magnetom Avanto 1.5T scanner. These data samples had a radial trajectory in k-space. There were a total of 63 radial lines with 512 samples each. This sampling density was relatively sparse. During the MR scanning, three coils/channels were used; the pulse sequence was trueFISP; and the scanning parameters were TR=4.8 milliseconds, TE=2.4 milliseconds, flip angle=60 degrees, FOV=206 millimeters with a resolution of approximately 256 pixels. The final image was obtained by taking the square root of the sum of the square of each channel, which separately went through an exemplary iterative procedure.

Figure 3A:
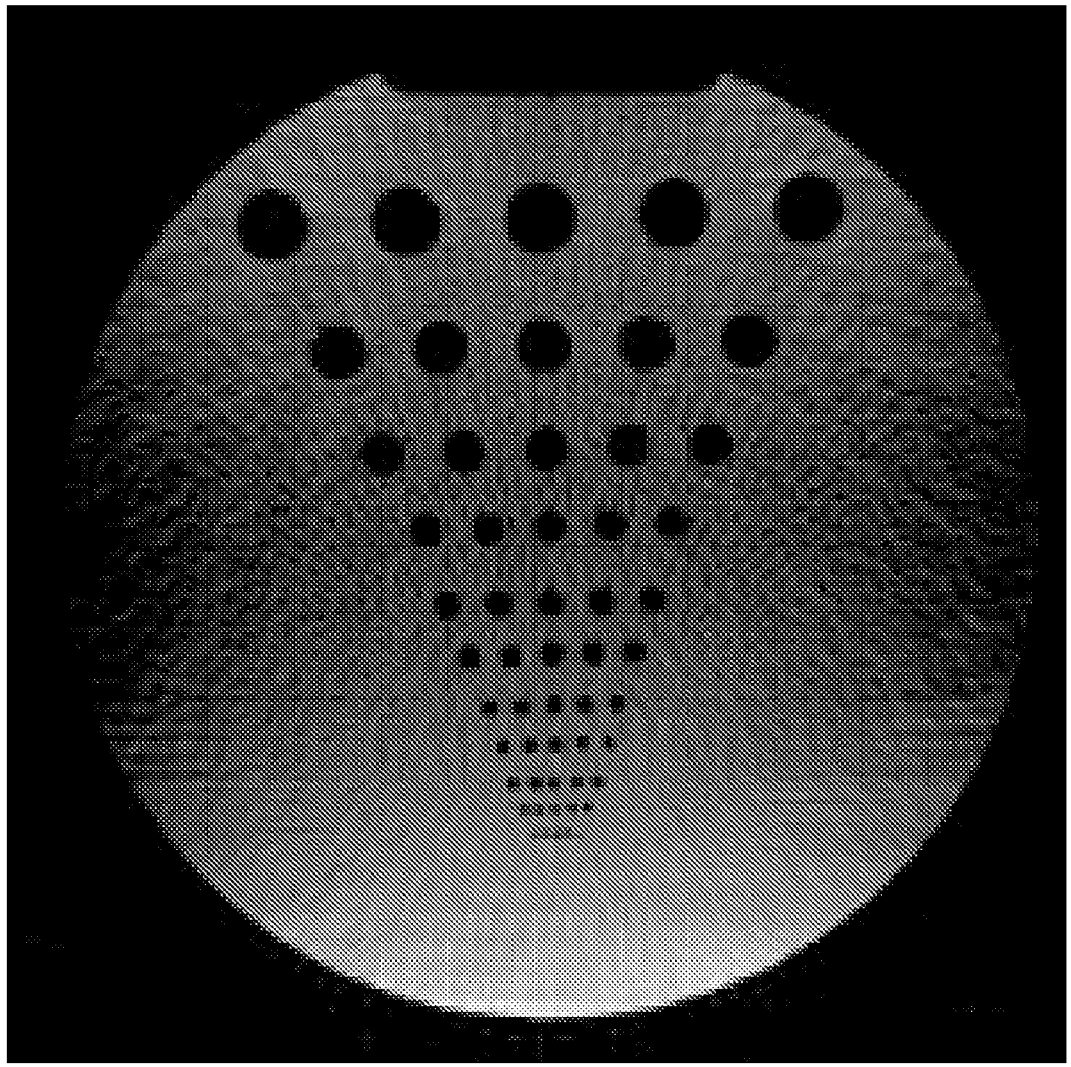
FIG. 3A is an exemplary gridding algorithm image.
Figure 3B:
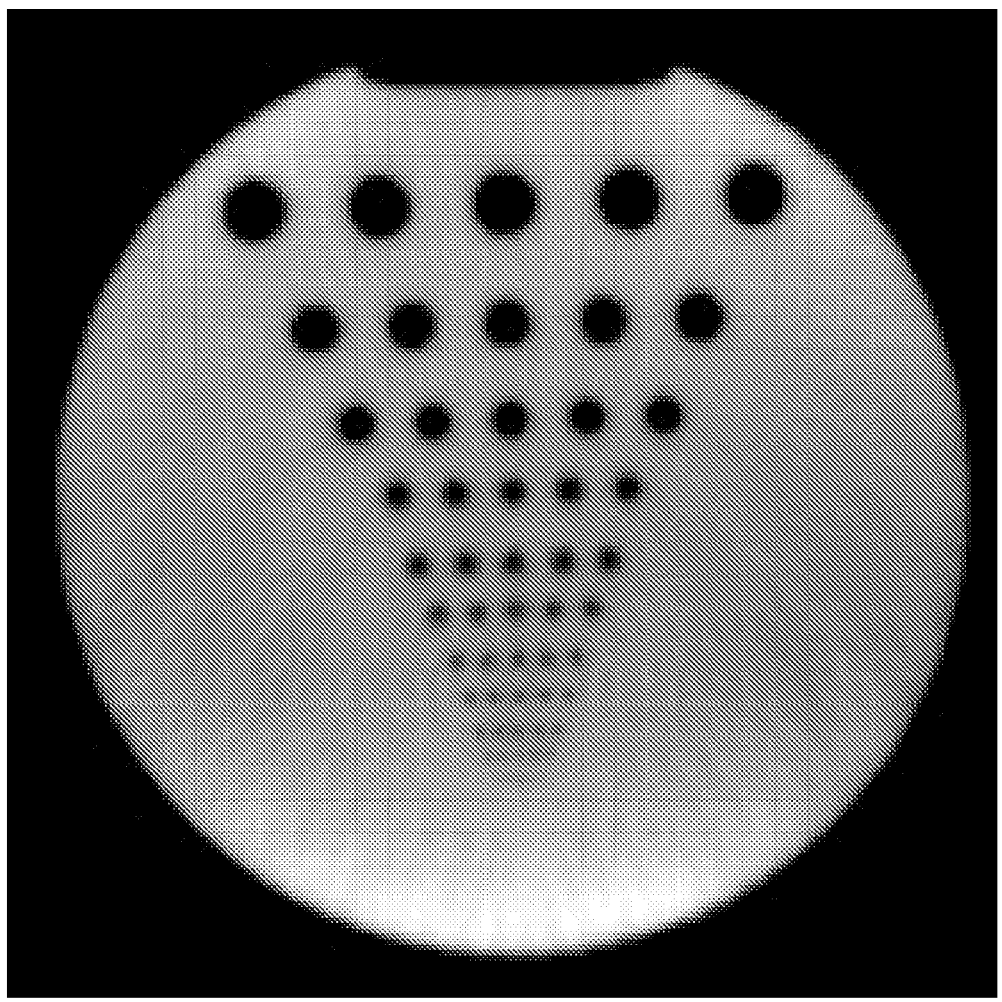
FIG. 3B is an exemplary image processed via a fast Fourier transform.
Figure 3C:
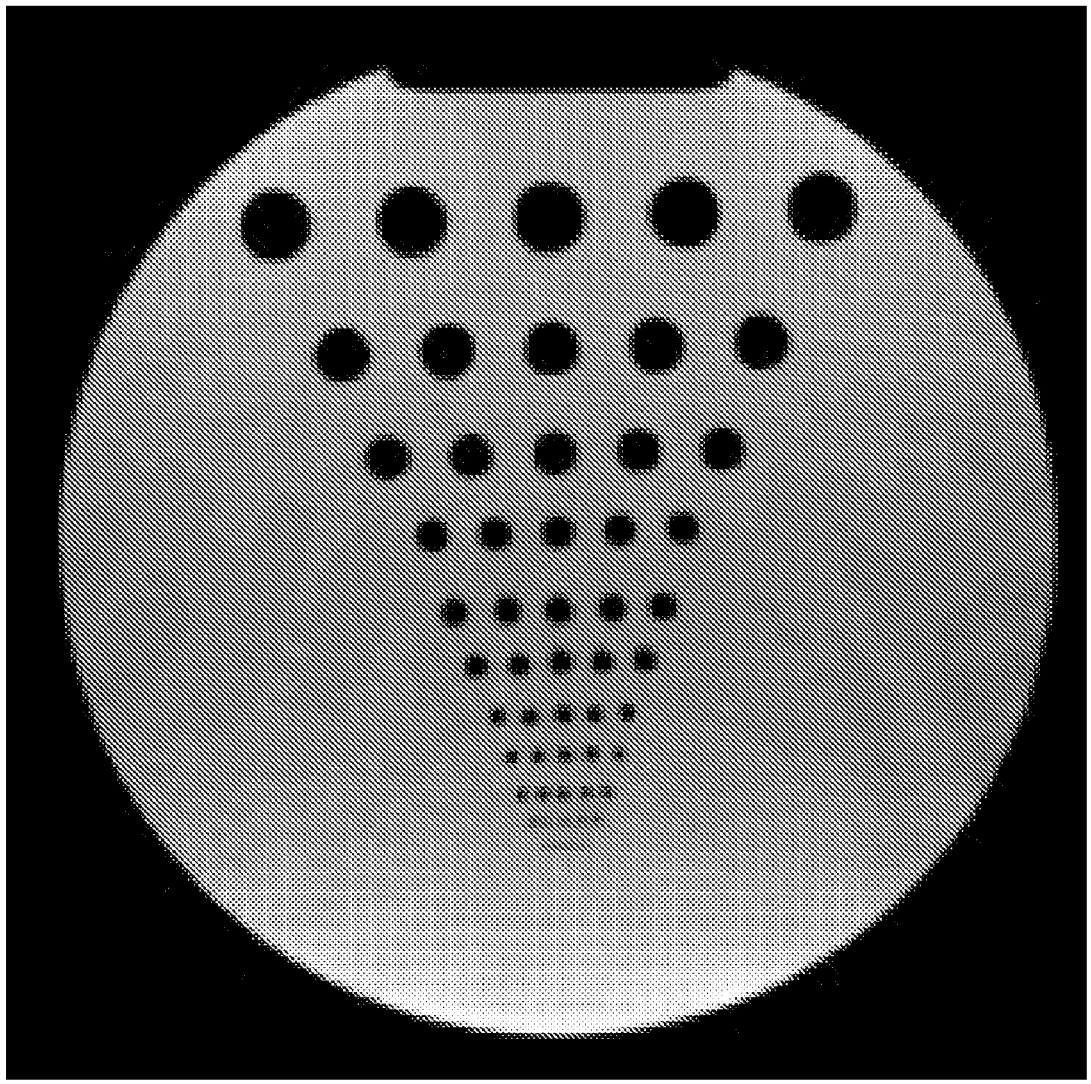
FIG. 3C is an exemplary image processed with iterative reconstruction without a Bregman iteration.
Figure 3D:
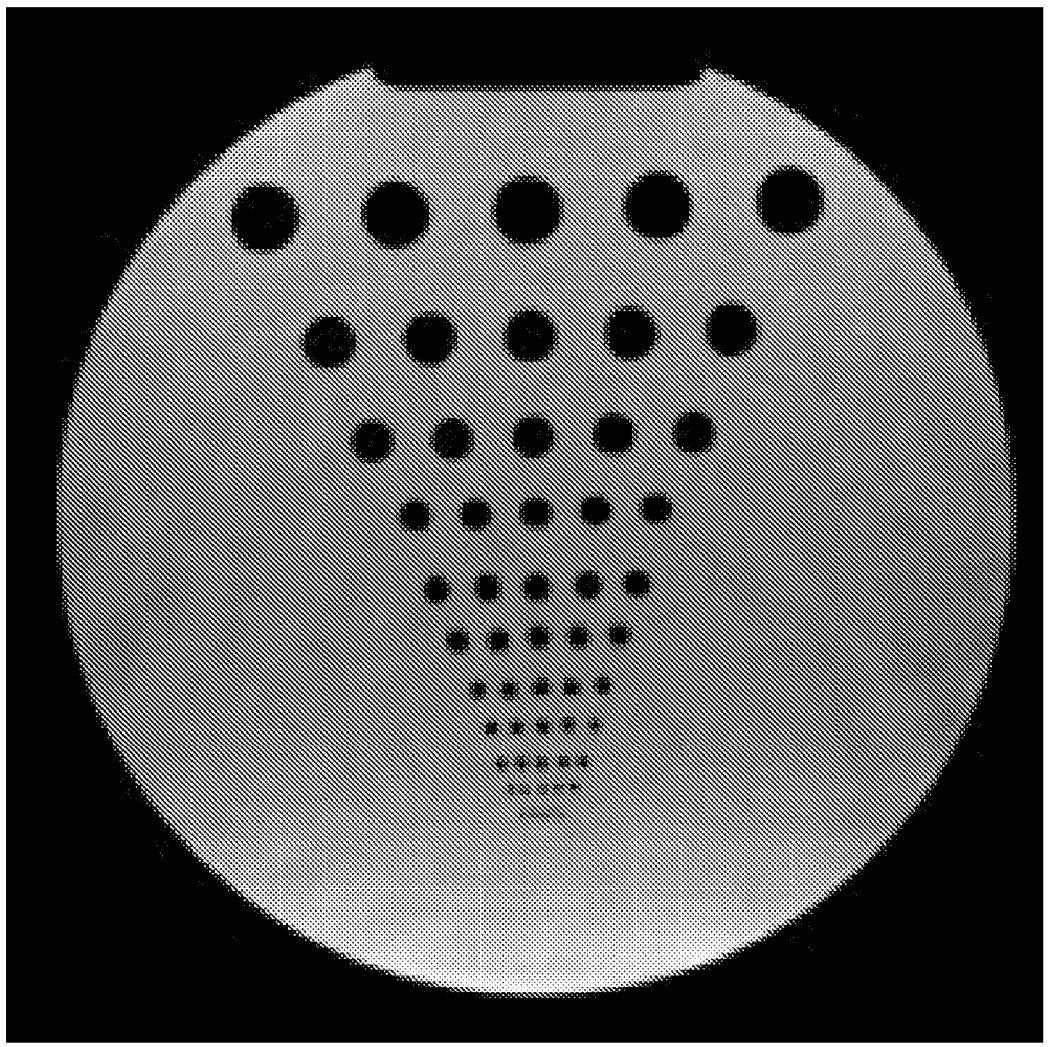
FIG. 3D is an exemplary image processed with iterative reconstruction with a Bregman iteration.

In this experiment, a Daubechies-8 wavelet was used for computing $\psi_2(m)$, and set $w_1=1$, $w_2=0.1$ and $\lambda=100$. FIG. 3A illustrates an image prepared without utilizing a Bregman iteration or applying an inverse NFFT. FIG. 3A has relatively strong streaking artifacts and is somewhat noisy. The image obtained from applying an inverse NUFFT from the raw measurement data is shown in FIG. 3B, which can be considered as a minimum energy reconstruction. The result without applying the Bregman iteration (the 0th Bregman iteration) is shown in FIG. 3C. This image demonstrates relatively good noise reduction. FIG. 3D illustrates an exemplary embodiment rendered following seven Bregman iterations. FIG. 3D shows relatively sharp image details.

Certain exemplary embodiments can comprise an iterative MR image reconstruction technique which optimizes, by means of Bregman iteration, a combined functional of a BV norm and a data fidelity term.

Definitions

When the following terms are used substantively herein, the accompanying definitions apply. These terms and definitions are presented without prejudice, and, consistent with the application, the right to redefine these terms during the prosecution of this application or any application claiming priority hereto is reserved. For the purpose of interpreting a claim of any patent that claims priority hereto, each definition (or redefined term if an original definition was amended during the prosecution of that patent), functions as a clear and unambiguous disavowal of the subject matter outside of that definition.

a—at least one.

absolute value—distance of a number from zero.

according to—as reported or stated by.

activity—an action, act, deed, function, step, and/or process and/or a portion thereof.

adapted to—suitable, fit, and/or capable of performing a specified function.

adjoint—a square matrix obtained from a given square matrix and having the property that its product with the given matrix is equal to the identity matrix times the determinant of the given matrix.

and/or—either in conjunction with or in alternative to.

another—a different one.

apparatus—an appliance or device for a particular purpose.

applied—incident directly and/or indirectly upon.

applying—to put to use for a purpose.

associate—to join, connect together, and/or relate.

at—in, on, and/or near.

attempt—to try to achieve.

attempts—one or more efforts or tries.

automatically—acting and/or operating in a manner essentially independent of external human influence and/or control. For example, an automatic light switch can turn on upon "seeing" a person in its view, without the person manually operating the light switch.

backtracking line search algorithm—an inexact line search method for an optimization procedure that repeatedly reduces the step size until a stopping criterion holds based upon determined in consideration of and/or derived from.

between—in a separating interval and/or intermediate to.

bounded variation—a function f(x) has a bounded variation if, over the closed interval $x \in [a,b]$, there exists a real number, M, such that $|f(x_1)-f(\alpha)|+|f(x_2)-f(x_1)|+ \ldots +|f(b)-f(x_{n-1})| \leq M$, for all $a < x_1 < x_2 < \ldots < x_{n-1} < b$.

Bregman distance—a distance between two points on a convex surface, the distance calculated according to an equation:

$$D_J(x,y)=J(x)-J(y)-<x-y,\partial J(y)>,$$

where:

$D_J(x,y)$ is the Bregman distance between image x and image y;

x is one image;

y is another image;

J is a convex function;

$<\cdot,\cdot>$ denotes an inner product in the real number space; and $\partial J(y)$ is an element of a sub-gradient of J at image y.

Bregman iteration—a repetitive attempt to minimize an expression that comprises a Bregman distance.

can—is capable of, in at least some embodiments.

cause—to produce an effect.

coarsest—most granular in character.

comparing—examining similarities or differences.

complete—finished.

complex—an expression comprising a real component and an imaginary component.

comprising—including but not limited to.

compute—to calculate, estimate, determine, and/or ascertain via a processor.

configure—to make suitable or fit for a specific use or situation.

conjugate gradient—an iterative algorithm for the numerical solution of particular systems of linear equations.

constant—continually occurring; persistent; and/or unchanging.

convert—to transform, adapt, and/or change.

convex—an surface such that for any pair of points on the surface, any point on the straight line segment that joins the pair of points is under the object coordinate system—a system for assigning a tuple of scalars to each point in an n-dimensional space.

count—(n.) a number reached by counting and/or a defined quantity. (v.) to increment, typically by one and beginning at zero.

create—to bring into being curvelet transform—a multiscale transform with a directional character in which elements are anisotropic at fine scales, with support shaped according to a parabolic scaling principle such that a square of a length of the transform is approximately equal to a width of the transform, data—information represented in a form suitable for processing by an information device.

data structure—an organization of a collection of data that allows the data to be manipulated effectively and/or a logical relationship among data elements that is designed to support specific data manipulation functions. A data structure can comprise meta data to describe the properties of the data structure. Examples of data structures can include: array, dictionary, graph, hash, heap, linked list, matrix, object, queue, ring, stack, tree, and/or vector.

define—to establish the outline, form, or structure of.

denote—to indicate.

derive—obtain via determining, calculating, and/or looking-up.

detect—to sense, perceive, identify, discover, ascertain, respond to, and/or receive the existence, presence, and/or fact of.

determination—an act of making or arriving at a decision.

determine—to obtain, calculate, decide, deduce, establish, and/or ascertain.

device—an instrumentality adapted to a particular purpose.

different—changed, distinct, and/or separate.

direction—a spatial relation between something and a course along which it points and/or moves; a distance independent relationship between two points in space that specifies the position of either with respect to the other; and/or a relationship by which the alignment and/or orientation of any position with respect to any other position is established.

distance—a measure of physical and/or logical separation.

each—every one of a group considered individually.

element—a component.

energy function—a mathematical representation of a closeness of fit of an entity to a model.

enhance—to improve or make better.

equation—a determinable mathematical expression.

estimate—to calculate and/or determine approximately and/or tentatively.

evaluate—to determine a value.

expression—a logical, proximal, and/or mathematical statement that comprises one or more symbols, words, and/or phrases.

Fourier transform—a reversible conversion of a first function into a second function. The second function, which is called a Fourier transform, provides coefficients of sinusoidal basis functions (vs. their frequencies) whose linear combination (summation or integral) produces the first function. Often applied to convert a function from the time domain into the frequency domain.

fidelity—accuracy of a copy as compared to a source of the copy.

final—last in a sequence.

finish—to complete.

formulate—to express in precise form.

from—used to indicate a source.

function—(n) a defined action, behavior, procedure, and/or mathematical relationship. (v) to perform as expected when applied.
functional—a function whose elements are functions, sets, or the like, and that assumes numerical values.
further—in addition.
generate—to create, produce, give rise to, and/or bring into existence.
haptic—involving the human sense of kinesthetic movement and/or the human sense of touch. Among the many potential haptic experiences are numerous sensations, body-positional differences in sensations, and time-based changes in sensations that are perceived at least partially in non-visual, non-audible, and non-olfactory manners, including the experiences of tactile touch (being touched), active touch, grasping, pressure, friction, traction, slip, stretch, force, torque, impact, puncture, vibration, motion, acceleration, jerk, pulse, orientation, limb position, gravity, texture, gap, recess, viscosity, pain, itch, moisture, temperature, thermal conductivity, and/or thermal capacity, etc.
horizontal—parallel to and/or in the plane of the horizon.
if—on condition that.
image—an at least two-dimensional representation of an entity and/or phenomenon.
imaginary—of or being the coefficient of an imaginary unit in a complex number.
index—something that serves to guide, point out, or otherwise facilitate reference.
information—facts, terms, concepts, phrases, expressions, commands, numbers, characters, and/or symbols, etc., that are related to a subject. Sometimes used synonymously with data, and sometimes used to describe organized, transformed, and/or processed data. It is generally possible to automate certain activities involving the management, organization, storage, transformation, communication, and/or presentation of information.
information device—any device capable of processing data and/or information, such as any general purpose and/or special purpose computer, such as a personal computer, workstation, server, minicomputer, mainframe, supercomputer, computer terminal, laptop, wearable computer, and/or Personal Digital Assistant (PDA), mobile terminal, Bluetooth device, communicator, "smart" phone (such as a Treo-like device), messaging service (e.g., Blackberry) receiver, pager, facsimile, cellular telephone, a traditional telephone, telephonic device, a programmed microprocessor or microcontroller and/or peripheral integrated circuit elements, an ASIC or other integrated circuit, a hardware electronic logic circuit such as a discrete element circuit, and/or a programmable logic device such as a PLD, PLA, FPGA, or PAL, or the like, etc. In general any device on which resides a finite state machine capable of implementing at least a portion of a method, structure, and/or or graphical user interface described herein may be used as an information device. An information device can comprise components such as one or more network interfaces, one or more processors, one or more memories containing instructions, and/or one or more input/output (I/O) devices, one or more user interfaces coupled to an I/O device, etc.
initialize—to prepare something for use and/or some future event.
inner product—a quantity obtained by multiplying corresponding coordinates of each of two vectors and adding the products.
input/output (I/O) device—any sensory-oriented input and/or output device, such as an audio, visual, haptic, olfactory, and/or taste-oriented device, including, for example, a monitor, display, projector, overhead display, keyboard, keypad, mouse, trackball, joystick, gamepad, wheel, touchpad, touch panel, pointing device, microphone, speaker, video camera, camera, scanner, printer, haptic device, vibrator, tactile simulator, and/or tactile pad, potentially including a port to which an I/O device can be attached or connected.
intermediate—between endpoints, yet not including an endpoint.
iteration—a repetition.
iterative—repeatedly.
k-space—an alternative terminology for the Fourier space. During magnetic resonance (MR) scanning, phase encoding data and frequency encoding data are acquired in k-space.
Lagrange Multiplier approach—a technique used with non-linear programming problems to find the extremum of $f(x_1, x_2, \ldots x_n)$ subject to the constraint $g(x_1, x_2, \ldots x_n)=C$, where f and g are functions with continuous first partial derivatives on the open set containing the curve $g(x_1, x_2, \ldots x_n)=0$, and $\nabla g \neq 0$ at any point on the curve (where $\nabla$ is the gradient). For an extremum to exist:

$$df = \frac{\partial f}{\partial x_1}dx_1 + \frac{\partial f}{\partial x_2}dx_2 + \ldots + \frac{\partial f}{\partial x_n}dx_n = 0, \text{ but} \quad (1)$$

$$dg = \frac{\partial g}{\partial x_1}dx_1 + \frac{\partial g}{\partial x_2}dx_2 + \ldots + \frac{\partial g}{\partial x_n}dx_n = 0, \quad (2)$$

multiplying (2) by the as yet unknown parameter $\lambda$ and add to (1):

$$\left(\frac{\partial f}{\partial x_1} + \lambda\frac{\partial g}{\partial x_1}\right)dx_1 + \left(\frac{\partial f}{\partial x_2} + \lambda\frac{\partial g}{\partial x_2}\right)dx_2 + \ldots + \left(\frac{\partial f}{\partial x_n} + \lambda\frac{\partial g}{\partial x_n}\right)dx_n = 0, \quad (3)$$

Note that the differentials are all independent, so we can set any combination equal to 0, and the remainder rust still give zero.

This implies that $$\frac{\partial f}{\partial x_k} + \lambda\frac{\partial g}{\partial x_k} = 0, \quad (4)$$

for all $k=1, \ldots, n$. The constant $\lambda$ is called the Lagrange multiplier. For multiple constraints, $g1=0, g2=0, \ldots,$ $$\nabla f = \lambda_1 \nabla g_1 + \lambda_2 \nabla g_2 + \ldots \quad (5)$$

length—a longest dimension of something and/or the measurement of the extent of something along its greatest dimension.
level—a relative position on a scale and/or a position along a vertical axis indicating height and/or depth.
lowest—smallest in magnitude.
machine instructions—directions adapted to cause a machine, such as an information device, to perform one or more particular activities, operations, or functions. The directions, which can sometimes form an entity called a "processor", "kernel", "operating system", "program", "application", "utility", "subroutine", "script", "macro", "file", "project", "module", "library", "class", and/or "object", etc., can be embodied as machine code, source code, object code, compiled code, assembled code, interpretable code, and/or executable code, etc., in hardware, firmware, and/or software.

machine—readable medium a physical structure from which a machine, such as an information device, computer, microprocessor, and/or controller, etc., can obtain and/or store data, information, and/or instructions. Examples include memories, punch cards, and/or optically-readable forms, etc.

magnetic resonance image device—an apparatus adapted to detect absorption and transmission of high-frequency radio waves by water molecules in objects and/or tissues placed in a strong magnetic field.

matrix—a rectangular array comprising rows and columns.

may—is allowed and/or permitted to, in at least some embodiments.

measured—determined, as a dimension, quantification, and/or capacity, etc. by observation.

memory device—an apparatus capable of storing analog or digital information, such as instructions and/or data. Examples include a non-volatile memory, volatile memory, Random Access Memory, RAM, Read Only Memory, ROM, flash memory, magnetic media, a hard disk, a floppy disk, a magnetic tape, an optical media, an optical disk, a compact disk, a CD, a digital versatile disk, a DVD, and/or a raid array, etc. The memory device can be coupled to a processor and/or can store instructions adapted to be executed by processor, such as according to an embodiment disclosed herein.

method—a process, procedure, and/or collection of related activities for accomplishing something.

minimization algorithm—a method adapted to adjust a variable and/or parameter to an approximate lowest level.

minimize—to adjust to a lowest level.

modify to change, cause to change, edit, alter, replace, delete, and/or correct.

multiscale—of or related to a plurality of scales.

network—a communicatively coupled plurality of nodes. A network can be and/or utilize any of a wide variety of sub-networks, such as a circuit switched, public-switched, packet switched, data, telephone, telecommunications, video distribution, cable, terrestrial, broadcast, satellite, broadband, corporate, global, national, regional, wide area, backbone, packet-switched TCP/P, Fast Ethernet, Token Ring, public Internet, private, ATM, multi-domain, and/or multi-zone sub-network, one or more Internet service providers, and/or one or more information devices, such as a switch, router, and/or gateway not directly connected to a local area network, etc.

network interface—any device, system, or subsystem capable of coupling an information device to a network. For example, a network interface can be a telephone, cellular phone, cellular modem, telephone data modem, fax modem, wireless transceiver, Ethernet card, cable modem, digital subscriber line interface, bridge, hub, router, or other similar device.

nonuniform—not homogenous.

norm—a vector function that assigns a positive size to all vectors of a vector space.

object—a physical thing; an item associated with a radio frequency identification tag; a grouping of data and/or executable instructions; and/or a discrete graphical item that can be selected and maneuvered, such as an onscreen graphic.

obtain—to receive, get, take possession of, procure, acquire, calculate, determine, and/or compute.

one—being or amounting to a single unit or individual or entire thing, item, and/or object.

orthogonal—of, or pertaining to two vectors having an inner product of zero.

wavelet—an oscillating function of time and/or space having its energy concentrated in time and/or space to give a tool for the analysis of transient, non-stationary, and/or time-varying phenomena.

wavelet transform—a representation of a signal in terms of a finite length and/or fast decaying oscillating waveform. This representation is a wavelet series, which is the coordinate representation of a square integrable function with respect to a complete, orthonormal set of basis functions for a Hilbert space of square integrable functions.

pixel—a smallest element of an image that can be individually processed.

plurality—the state of being plural and/or more than one.

predetermine—to determine, decide, or establish in advance.

probability—a quantitative representation of a likelihood of an occurrence.

processor—a device and/or set of machine-readable instructions for performing one or more predetermined tasks. A processor can comprise any one or a combination of hardware, firmware, and/or software. A processor can utilize mechanical, pneumatic, hydraulic, electrical, magnetic, optical, informational, chemical, and/or biological principles, signals, and/or inputs to perform the task(s). In certain embodiments, a processor can act upon information by manipulating, analyzing, modifying, converting, transmitting the information for use by an executable procedure and/or an information device, and/or routing the information to an output device. A processor can function as a central processing unit, local controller, remote controller, parallel controller, and/or distributed controller, etc. Unless stated otherwise, the processor can be a general-purpose device, such as a microcontroller and/or a mnicroprocessor, such the Pentium TV series of microprocessor manufactured by the Intel Corporation of Santa Clara, Calif. In certain embodiments, the processor can be dedicated purpose device, such as an Application Specific Integrated Circuit (ASIC) or a Field Programmable Gate Array (FPGA) that has been designed to implement in its hardware and/or firmware at least a part of an embodiment disclosed herein.

project—to calculate, estimate, or predict.

provide—to furnish, supply, give, and/or make available.

real number portion—of or being the coefficient of a real component of a complex number.

receive—to get as a signal, take, acquire, and/or obtain.

recommend—to suggest, praise, commend, and/or endorse.

reduce—to make and/or become lesser and/or smaller.

regularization function—an analytic expression that enforces certain model conditions to solve an ill-posed and/or ill-conditioned problem.

related—associated with.

render to display, annunciate, speak, print, and/or otherwise make perceptible to a human, for example as data, commands, text, graphics, audio, video, animation, and/ or hyperlinks, etc., such as via any visual, audio, and/or haptic means, such as via a display, monitor, printer, electric paper, ocular implant, cochlear implant, speaker, etc.

repeat—to do and/or perform again.

repeatedly—again and again; repetitively.

representation—an approximation, equivalent, mathematical characterization, rendering, image, and/or likeness of something.

request—to express a desire for and/or ask for.

said—when used in a system or device claim, an article indicating a subsequent claim term that has been previously introduced.

scaling functions—a mathematical expression adapted to model a signal with a low-pass spectrum. A scaling function can generate basis functions for each Hilbert subspace via scaling and/or translation of variables.

select—to make a choice or selection from alternatives.

set—a related plurality of predetermined elements; and/or one or more distinct items and/or entities having a specific common property or properties.

signal—information, such as machine instructions for activities, encoded as automatically detectable variations in a physical variable, such as a pneumatic, hydraulic, acoustic, fluidic, mechanical, electrical, magnetic, optical, chemical, and/or biological variable, such as power, energy, pressure, flowrate, viscosity, density, torque, impact, force, voltage, current, resistance, magnetomotive force, magnetic field intensity, magnetic field flux, magnetic flux density, reluctance, permeability, index of refraction, optical wavelength, polarization, reflectance, transmittance, phase shift, concentration, and/or temperature, etc. Depending on the context, a signal can be synchronous, asynchronous, hard real-time, soft real-time, non-real time, continuously generated, continuously varying, analog, discretely generated, discretely varying, quantized, digital, continuously measured, and/or discretely measured, etc.

size—physical dimensions, proportions, magnitude, amount, and/or extent of an entity.

small relatively diminutive in magnitude.

solve—to find an answer to a problem.

sparse—a matrix populated primarily with zeros.

step—one of a series of actions, processes, or measures taken to achieve a goal.

store—to place, hold, and/or retain data, typically in a memory.

sub-algorithm—a portion of an algorithm.

substantially—to a great extent or degree.

symbol—any individual part of an identifier. A symbol can be, for example, a letter, number, keyboard symbol, and/or any other symbol.

system a collection of mechanisms, devices, data, and/or instructions, the collection designed to perform one or more specific functions.

term—a defined quantity of a mathematical formula.

transformation—a conversion of a first representation of an entity to a second representation of the entity.

transmit—to send as a signal, provide, furnish, and/or supply.

trial—exemplary as for testing.

undersampled—a detected specimen not fully representative of a whole.

update—to change.

user interface—any device for rendering information to a user and/or requesting information from the user. A user interface includes at least one of textual, graphical, audio, video, animation, and/or haptic elements. A textual element can be provided, for example, by a printer, monitor, display, projector, etc. A graphical element can be provided, for example, via a monitor, display, projector, and/or visual indication device, such as a light, flag, beacon, etc. An audio element can be provided, for example, via a speaker, microphone, and/or other sound generating and/or receiving device. A video element or animation element can be provided, for example, via a monitor, display, projector, and/or other visual device. A haptic element can be provided, for example, via a very low frequency speaker, vibrator, tactile stimulator, tactile pad, simulator, keyboard, keypad, mouse, traekball, joystick, gamepad, wheel, touchpad, touch panel, pointing device, and/or other haptic device, etc. A user interface can include one or more textual elements such as, for example, one or more letters, number, symbols, etc. A user interface can include one or more graphical elements such as, for example, an image, photograph, drawing, icon, window, title bar, panel, sheet, tab, drawer, matrix, table, form, calendar, outline view, frame, dialog box, static text, text box, list, pick list, pop-up list, pulldown list, menu, tool bar, dock, check box, radio button, hyperlink, browser, button, control, palette, preview panel, color wheel, dial, slider, scroll bar, cursor, status bar, stepper, and/or progress indicator, etc. A textual and/or graphical element can be used for selecting, programming, adjusting, changing, specifying, etc. an appearance, background color, background style, border style, border thickness, foreground color, font, font style, font size, alignment, line spacing, indent, maximum data length, validation, query, cursor type, pointer type, autosizing, position, and/or dimension, etc. A user interface can include one or more audio elements such as, for example, a volume control, pitch control, speed control, voice selector, and/or one or more elements for controlling audio play, speed, pause, fast forward, reverse, etc. A user interface can include one or more video elements such as, for example, elements controlling video play, speed, pause, fast forward, reverse, zoom-in, zoom-out, rotate, and/or tilt, etc. A user interface can include one or more animation elements such as, for example, elements controlling animation play, pause, fast forward, reverse, zoom-in, zoom-out, rotate, tilt, color, intensity, speed, frequency, appearance, etc. A user interface can include one or more haptic elements such as, for example, elements utilizing tactile stimulus, force, pressure, vibration, motion, displacement, temperature, etc.

utilize—to use and/or put into service.

vector—an expression characterized by a magnitude and a direction.

vertical—substantially perpendicular to horizontal.

via—by way of and/or utilizing.

weight—a value indicative of importance.

when—at a time.

where—in a situation or position.

wherein—in regard to which; and; and/or in addition to.

with—accompanied by.

Note

Still other practical and useful embodiments will become readily apparent to those skilled in this art from reading the above-recited detailed description and drawings of certain exemplary embodiments. It should be understood that numerous variations, modifications, and additional embodiments are possible, and accordingly, all such variations, modifications, and embodiments are to be regarded as being within the spirit and scope of this application.

Thus, regardless of the content of any portion (e.g., title, field, background, summary, abstract, drawing figure, etc.) of this application, unless clearly specified to the contrary, such as via an explicit definition, assertion, or argument, with respect to any claim, whether of this application and/or any claim of any application claiming priority hereto, and whether originally presented or otherwise:

there is no requirement for the inclusion of any particular described or illustrated characteristic, function, activity, or element, any particular sequence of activities, or any particular interrelationship of elements;

any elements can be integrated, segregated, and/or duplicated;

any activity can be repeated, performed by multiple entities, and/or performed in multiple jurisdictions; and any activity or element can be specifically excluded, the sequence of activities can vary, and/or the interrelationship of elements can vary.

Moreover, when any number or range is described herein, unless clearly stated otherwise, that number or range is approximate. When any range is described herein, unless clearly stated otherwise, that range includes all values therein and all subranges therein. For example, if a range of 1 to 10 is described, that range includes all values therebetween, such as for example, 1.1, 2.5, 3.335, 5, 6.179, 8.9999, etc., and includes all subranges therebetween, such as for example, 1 to 3.65, 2.8 to 8.14, 1.93 to 9, etc.

Any information in any material berg, a United States patent, United States patent application, book, article, etc.) that has been incorporated by reference herein, is only incorporated by reference to the extent that no conflict exists between such information and the other statements and drawings set forth herein. In the event of such conflict, including a conflict that would render invalid any claim herein or seeking priority hereto, then any such conflicting information in such incorporated by reference material is specifically not incorporated by reference herein.

Accordingly, the descriptions and drawings are to be regarded as illustrative in nature, and not as restrictive.

What is claimed is:

1. A method comprising:
receiving a first set of data from a magnetic resonance image device;
automatically applying a minimization algorithm to a pre-formulated functional that comprises a norm of a sparse representation of a trial image derived from said first set of data and a data fidelity term, said minimization algorithm comprising a conjugate gradient sub-algorithm and a Bregman iteration;
at each iteration of a plurality of iterations of said Bregman iteration:
updating said data fidelity term; and
repeating said conjugate gradient sub-algorithm to iteratively update said trial image, said conjugate gradient sub-algorithm comprising:
at each iteration of a plurality of iterations, finding an update direction of said trial image via:
computing a sub-gradient of said norm of said sparse image representation and a gradient of said data fidelity term;
applying a nonuniform Fourier transform of said trial image;
subtracting said first set of data from said nonuniform Fourier transform;
using an adjoint of said nonuniform Fourier transform to obtain said gradient of said data fidelity term;
finding a step size in said update direction using a backtracking line search algorithm;
updating said trial image based upon said update direction and said step size; and
rendering a final image when said Bregman iteration is finished.

2. A method comprising:
providing a processor and a medium with machine instructions adapted to render a final enhanced image of an object based upon a final enhanced set of data, said final enhanced set of data derived from a detected set of data obtained from a magnetic resonance device, said final enhanced set determined via a minimization algorithm applied to a formulated functional, said formulated functional based upon a trial image derived from said detected set of data, said minimization algorithm adapted to iteratively utilize a conjugate gradient sub-algorithm and a Bregman iteration, said formulated functional comprising:
a norm of a sparse representation of said trial image derived from said detected set of data; and
a data fidelity term; and further comprising: at each iteration of a plurality of iterations of said conjugate gradient sub-algorithm: finding an update direction of said trial image via: computing a sub-gradient of said norm of said sparse image representation and a gradient of said data fidelity term; applying a nonuniform Fourier transform of said trial image; subtracting said first set of data from said nonuniform Fourier transform; using an adjoint of said nonuniform Fourier transform to obtain said gradient of said data fidelity term; finding a step size in said update direction using a backtracking line search algorithm; and updating said trial image based upon said update direction and said step size.

3. The method of claim 2, further comprising:
obtaining said detected set of data from said magnetic resonance image device.

4. The method of claim 2, further comprising:
applying said minimization algorithm to said formulated functional.

5. The method of claim 2, further comprising:
determining said norm of said sparse representation of said trial image derived from said detected set of data.

6. The method of claim 2, further comprising:
at each iteration of a plurality of iterations of said Bregman iteration:
updating said data fidelity term; and
repeating said conjugate gradient sub-algorithm to iteratively update said trial image.

7. The method of claim 2, further comprising:
determining said sparse representation of said trial image derived from said detected set of data.

8. The method of claim 2, wherein said minimization algorithm attempts to minimize an equation:

$$\min_{m} \|\Psi(m)\|_1 + \lambda \|Am - y\|_2^2$$

where:
m is a representation of said trial image;
ψ is a transformation that transforms said representation of said trial image into a sparse representation;
λ is a Lagrange multiplier;
∥ ∥ is a norm;
A is a non-uniform Fourier transform matrix; and
y is undersampled measured k-space data.

9. The method of claim 2, wherein said formulated functional comprises a term:

$$\|m\|_{BV} = \sum_{i,j} \sqrt{|\nabla_x m_{re}(i,j)|^2 + |\nabla_x m_{im}(i,j)|^2 + |\nabla_y m_{re}(i,j)|^2 + |\nabla_y m_{im}(i,j)|^2}$$

where:
m is a representation of said trial image;
$m_{re}$ is a real component of said representation of said trial image;
$m_{im}$ is an imaginary component of said representation of said trial image;
ψ is a transformation that transforms said representation of said trial image into a sparse representation;
$\|m\|_{BV}$ is a bounded variation norm;
∇ is a gradient symbol;
∥ is an absolute value of an expression;
x is a horizontal direction in said representation of said trial image in a predetermined coordinate system;
y is a vertical direction in said representation of said trial image in said predetermined coordinate system;
i is an index for pixels in a vertical direction in said predetermined coordinate system; and
j is an index for pixels in a horizontal direction in said predetermined coordinate system.

10. The method of claim 2, wherein said conjugate gradient sub-algorithm comprises evaluating an equation:

$$\nabla \|m\|_{BV} = \zeta_{i-1,j}^x - \zeta_{i,j}^x + \zeta_{i,j-1}^y - \zeta_{i,j}^y,$$

where:

$$\zeta_{i,j}^x = \frac{\nabla_x m(i,j)}{\sqrt{|\nabla_x m_{re}(i,j)|^2 + |\nabla_y m_{re}(i,j)|^2 + |\nabla_x m_{im}(i,j)|^2 + |\nabla_y m_{im}(i,j)|^2 + \varepsilon}};$$

$$\zeta_{i,j}^y = \frac{\nabla_y m(i,j)}{\sqrt{|\nabla_x m_{re}(i,j)|^2 + |\nabla_y m_{re}(i,j)|^2 + |\nabla_x m_{im}(i,j)|^2 + |\nabla_y m_{im}(i,j)|^2 + \varepsilon}};$$

m is a representation of said trial image;
$m_{re}$ is a real component of said representation of said trial image;
$m_{in}$ is an imaginary component of said representation of said trial image;
ε is a small constant;
∇ is a gradient symbol;
∥ is an absolute value of an expression;
x is a horizontal direction in said representation of said trial image in a predetermined coordinate system;
y is a vertical direction in said representation of said trial image in said predetermined coordinate system;
i is an index for pixels in a vertical direction in said predetermined coordinate system; and
j is an index for pixels in a horizontal direction in said predetermined coordinate system.

11. The method of claim 2, wherein said formulated functional comprises a term:

$$m = \sum_p \alpha_{L,p} \varphi_{L,p} + \sum_{q=L+1}^{J} \sum_p \alpha_{q,p} \phi_{q,p}$$

where:
m is a representation of said trial image;
J is related to a length of said signal by $N=2^J$;
L is a lowest level (coarsest level) in a multiscale representation;
$\alpha_{p,q}$ are transformed coefficients;
$\phi_{L,p}$ are scaling functions;
$\phi_{q,p}$ are oscillatory wavelets;
q is an index for different levels; and
p is an index for a $p^{th}$ element in said multiscale representation.

12. The method of claim 2, wherein said formulated functional comprises a curvelet transform.

13. The method of claim 2, wherein said Bregman iteration comprises attempting to solve an equation:

$$m_k^* = \arg\min_m \{J(m) + \lambda H(m, y + v_{k-1}^*)\}$$

where:
m is a representation of said trial image;
k is an iteration count for said Bregman iteration;
J(m) is a regularization function;
$H(m, y+v^*_{k-1})$ is a data fidelity term; and
λ is a Lagrange multiplier.

14. The method of claim 7, further comprising:
at each iteration of a plurality of iterations of said conjugate gradient sub-algorithm, determining a non-uniform Fourier transform of an intermediate enhanced image.

15. The method of claim 2, further comprising:
at each iteration of a plurality of iterations of said conjugate gradient sub-algorithm, determining a non-uniform Fourier transform of an intermediate enhanced image; and
comparing said non-uniform Fourier transform to said detected set of data.

16. The method of claim 2, wherein said minimization algorithm further comprises a backtracking line search algorithm.

17. The method of claim 2, further comprising:
determining that said minimization algorithm is complete.

18. A machine-readable medium storing machine instructions implementing the steps of:
providing machine instructions adapted to render a final enhanced image of an object based upon a final enhanced set of data, said final enhanced set of data derived from a detected set of data obtained from a magnetic resonance device, said final enhanced set determined via a minimization algorithm applied to a formulated functional, said formulated functional based upon a trial image derived from said detected set of data, said minimization algorithm adapted to iteratively utilize a conjugate gradient sub-algorithm and a Bregman iteration, said formulated functional comprising:
a norm of a sparse representation of said trial image derived from said detected set of data; and
a data fidelity term; and further comprising: at each iteration of a plurality of iterations of said conjugate gradient sub-algorithm: finding an update direction of said trial image via: computing a sub-gradient of said norm of saidsparse image representation and a gradient of said data fidelity term; applying anonuniform Fourier transform of said trial image; subtracting said first set of data from said nonuniform Fourier transform; using an adjoint of said nonuniformFourier transform to obtain said gradient of said data fidelity term; finding a step size in said update direction using a backtracking line search algorithm; andupdating said trial image based upon said update direction and said step size.

* * * * *